United States Patent [19]

Iio et al.

[11] Patent Number: 5,061,189

[45] Date of Patent: Oct. 29, 1991

[54] LAMP SOCKET FOR USE WITH A PRINTED CIRCUIT BOARD

[75] Inventors: Masaaki Iio; Masamitsu Nagano, both of Imabari, Japan

[73] Assignee: Harison Electric Co., Ltd., Imabari, Japan

[21] Appl. No.: 642,179

[22] Filed: Jan. 18, 1991

Related U.S. Application Data

[63] Continuation of Ser. No. 506,933, Apr. 10, 1990, abandoned.

[30] Foreign Application Priority Data

Oct. 31, 1989 [JP] Japan .................................. 1-128217

[51] Int. Cl.⁵ .............................................. H05K 1/00
[52] U.S. Cl. ........................................ 439/57; 439/547
[58] Field of Search ........................... 439/611–619, 439/699, 56, 57, 544, 545, 547, 554

[56] References Cited

U.S. PATENT DOCUMENTS

| | | | |
|---|---|---|---|
| 3,522,579 | 8/1970 | Matsuya | 439/619 |
| 3,859,554 | 1/1975 | Priziosi et al. | 439/619 |
| 4,193,653 | 3/1980 | Aizawa | 339/17 |
| 4,289,430 | 11/1981 | Baba et al. | 339/17 D |

*Primary Examiner*—David L. Pirlot
*Attorney, Agent, or Firm*—Harlan P. Huebner

[57] ABSTRACT

A lamp socket including a lamp receptacle to receive a baseless lamp having wires, said socket including a base projecting annularly radially outward from said receptacle and having wire passageways from said receptacle as well as wire receiving grooves projecting inwardly from a bottom surface of said base and communicating therewith. The base includes a top surface of a common plane and the arrangements of said grooves in orthogonal pairs is such as to increase the area of said base therebetween. Said receptacle is fitted with wire divider means to facilitate the threading of said wires through said wire passageways.

4 Claims, 3 Drawing Sheets

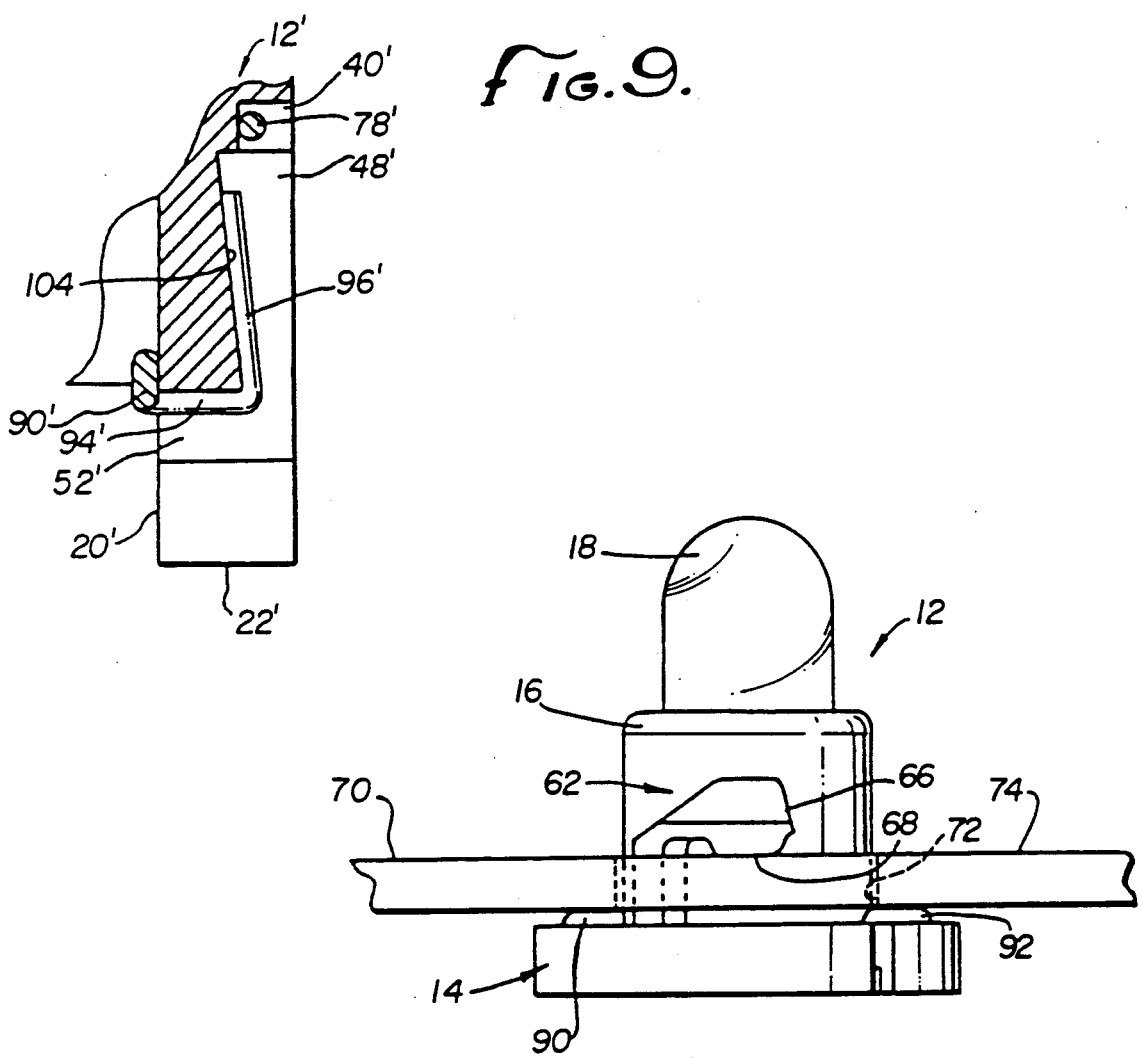
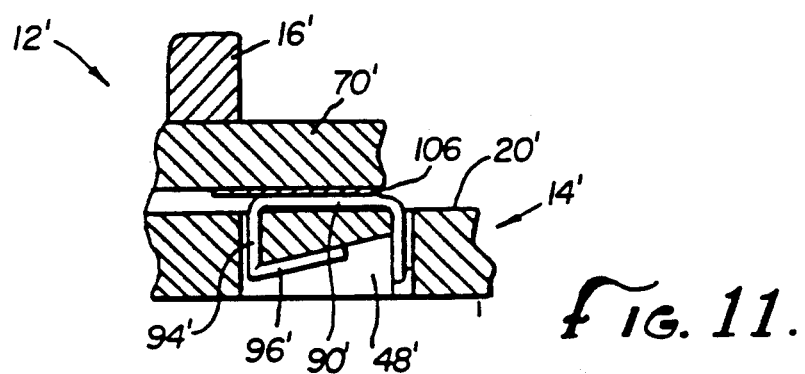

LAMP SOCKET FOR USE WITH A PRINTED CIRCUIT BOARD

This is a continuation of copending application Ser. No. 07/506,933 filed Apr. 10, 1990, now abandoned.

BACKGROUND OF THE INVENTION

1. Field of The Invention

The present invention relates to a lamp socket for receiving a baseless lamp and for mounting on a printed circuit board.

2. Description of the Prior Art

There have been prior lamp sockets that receive baseless lamps where the socket is adapted to sandwich a printed circuit board. The socket, when in position will receive electricity from contacts on the board to lead wires from the lamp to illuminate the same.

The prior art sockets are of plastic that have a tendency to soften when heat is applied, such as when the lamp is lit or heat is generated by the electrical contacts.

In addition, the prior art sockets are provided on the lamp receptacle portion with peripheral locking tabs so that the receptacle portion may pass upward through an opening in a printed circuit board with a base portion of the socket engaging the underside of the board. The lamp receptacle is then turned and the locking tabs engage the top of the board and the entire socket assembly is locked in place. In order to illuminate a lamp placed in the receptacle, the prior art has threaded lead wires from the lamp through the base bending the same for return on the top surface of the base. With the lead wires on the top of the base, they will be in contact with conductive strip elements of the printed circuit board to pass electricity to the lamp.

Heretofore the passages in the socket for the lead wires of the lamp have been relatively small and spaced apart as best seen in U.S. Pat. Nos. 4,193,653 and 4,289,430. As can be seen from those patents, the spacing and size of the holes required manual threading of the lead wires through the respective holes. This is time consuming and requires and pre-straightening of the wires to effect entry.

In addition, each of the aforestated patents on the top surface of the base have projections from the top where the lead wires will pass over and where the wires contact the printed circuit board. Again, as can be seen, the projections are less than the length of the lead wires on the top surface so that there is a relatively small area of contact with the wires. The remaining portion of the lead wire on the surface of the wire reach is elevated above the top surface with no support underneath.

With the structure just described, the softening of the plastic will allow a groove to be formed under the wire reach which will cause the wire on the projection to pull away from the board contact causing unwanted flickering and inoperativeness of the lamp.

In addition, it should be noted that the positioning of the grooves on the underside of the base of either of the afore identified patents is such as to make them relatively close to a peripheral edge of the base. This will assist in causing greater softening of the plastic so that the unwanted groove under the wire reach is further enlarged or depressed.

Also, with the prior art devices there are no means to truly maintain the lead wires in position as they are bent from holes to grooves to holes to the upper surface. Such lack of holding may also cause the lead wires to move which in turn may cause faulty electrical connections.

SUMMARY OF THE INVENTION

It is an object of the present invention to provide a lamp socket wherein there is a lamp receptacle having a wire divider means in the bottom thereof which will assure ease of dividing and threading lead wires of a lamp to be inserted in the receptacle.

A further object of the present invention is to provide a wire divider means that includes a truncated projection that is an elongated pyramidal wall terminating in holes passing through said base of said socket.

Another object of the present invention is to provide a top surface of a base portion of the socket which is flat and the entire surface is on a common plane.

Yet another object of the present invention is to provide wire receiving grooves on the underside of the base portion of the socket that communicate with holes extending from the lamp receptacle that include wire locking means to maintain the lead wires of said lamp in a bent position preventing movement thereof.

Another object of the present invention is to provide locking tabs in wire receiving grooves as the wire locking means to be deformed to maintain the wire.

Another object of the present invention is to provide a wire locking means in the form of wire groove bottoms offset from the plane of the top surface of the base wherein wire wrapped around and into said angled bottom groove will be locked against dislocation caused by vibration and/or heat.

A still further object of the present invention is to provide wire receiving grooves in the underside of the base portion, wherein each of said pair of grooves are orthogonally arranged one with the other so that the base portion between the orthogonal grooves is relatively thick to reduce softening during illumination of the lamp in the socket and prevent the lead wires from "grooving."

These and other objects and advantages will become apparent from the following part of the specification wherein details have been described for the competence of disclosure, without intending to limit the scope of the invention which is set forth in the appended claims.

BRIEF DESCRIPTION OF THE DRAWINGS

These advantages may be more clearly understood from the following description and by reference to the drawings in which:

FIG. 9 is a partially cut-away enlarged sectional view of the modification of FIG. 8;

FIG. 10 is a side elevational view illustrating the lamp base mounted on a printed circuit board; and FIG. 11 is an enlarged sectional view illustrating the modified lamp base and the printed circuit board of FIG. 11.

DESCRIPTION OF THE PREFERRED EMBODIMENTS

Illustrative embodiments of the present invention will hereinafter be described in detail with reference to the accompanying drawings.

Figure 1:
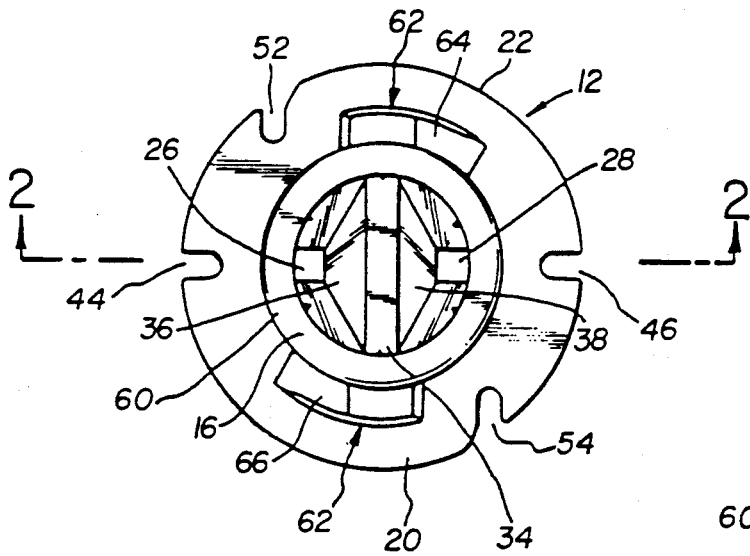
FIG. 1 is a top plan view illustrating a socket for a lamp according to the present invention.
Figure 2:
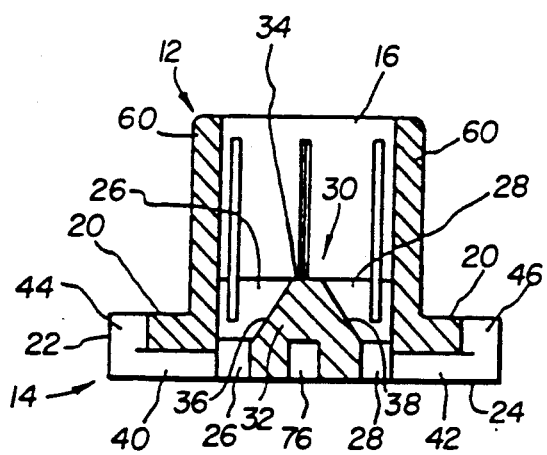
FIG. 2 is a cross sectional side elevational view taken on line 2—2 of FIG. 1.
Figure 3:
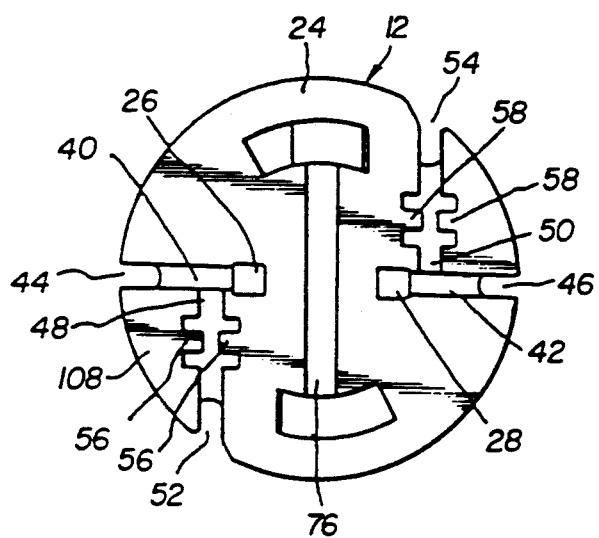
FIG. 3 is a bottom plan view of the lamp socket of the present invention.
Figure 4:
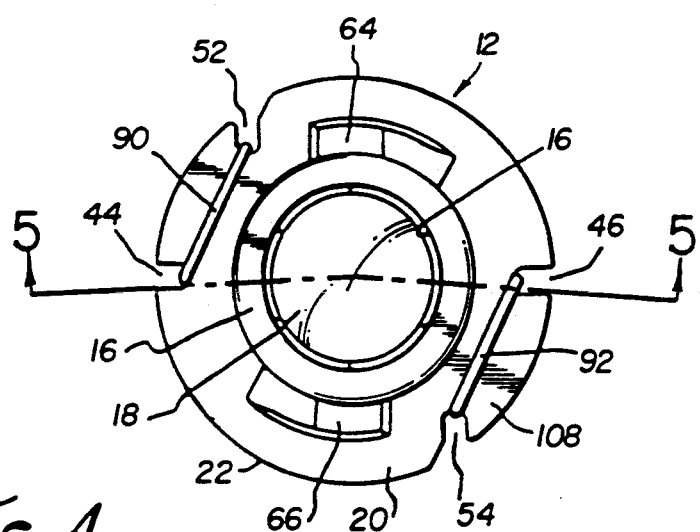
FIG. 4 is a top plan view of a lamp mounted in the lamp socket of the present invention.

Turning first to FIGS. 1 through 3, a lamp socket generally designated 12 adapted to receive a lamp is illustrated. The socket 12 is preferably composed of a cylindrical base designated 14 internally formed with a lamp mounting receptacle 16 into which a lamp 18 is mounted, see FIGS. 4 and 5. The lamp socket 12 is preferably form from a thermoplastic synthetic resin by molding. The base 14 that projects outwardly beyond the receptacle 16 includes a generally flat annular top surface 20, annular side wall 22 and a flat bottom surface 24.

Within the receptacle 16 at the bottom there are lead wire insertion holes 26 and 28 passing through the base 14 and through surface 24 The receptacle 16 includes a wire guide divider and stop means 30 that preferably includes a truncated projection 32 which is horizontally elongated across the diameter of the receptacle 16.

The projection 32 includes a lamp stop surface 34 and a pair of opposed tapered guide walls 36 and 38. The walls 36 and 38 terminate at the lead wire insertion holes 26 and 28 and a funnel on each side is achieved across the walls 36 and 38 and between them and the inner wall of the receptacle toward the insertion holes to channel wires (to be described) into the holes 26 and 28. The construction of the guide means 30 assures that any wires started toward the walls 36 and 38 will be assured entry and will not hang up before entry into the holes 26 and 28.

The bottom surface 24 of the base 14 is provided with lead wire guide grooves 40 and 42, communicating with the lead wire insertion holes 26 and 28. The grooves 40 and 42 project radially outwardly toward annular side wall 22. Projecting through wall 22 are vertical lead wire insertion grooves 44 and 46 that intersect the lead wire guide grooves 40 and 42.

The bottom surface 24 also includes return lead wire stopper grooves 48 and 50 which are preferably on a plane normal to the lead wire guide grooves 40 and 42 so as to communicate with a pair of vertical lead wire insertion grooves 52 and 54, respectively. The lead insertion grooves 52 and 54 are recessed from the outer circumference of the side wall 22 towards inner ends of the lead wire stopper grooves 48 and 50 and at right vertical angles thereto.

Projecting into grooves 48 and 50 are locking means or wire locking tabs 56 and 58 respectively. The tabs preferably face each other in an open position, FIG. 3 and a closed locking position, FIG. 6 where they may be crushed close. The tabs 56 and 58 may be crushed or deformed by any conventional means.

Disposed on the outer peripheral wall 60 of the receptacle 12 and projecting from top surface 20 at base 14 are lamp socket locking means designated 62, as best seen in FIGS. 1 and 10. There are preferably two means 62 each on opposite sides of wall 60. The means 62 include arms 64 and 66 that have locking surfaces 68 that cooperate to bias against a conventional circuit printed circuit board 70. Preferably the socket 12 is inserted through an opening 72 in the board 70 and is twisted so the surfaces 68 will engage the top surface 74 of the board. The bottom surface 24 of the base 14 may be provided with a tool engaging groove 76 in which to fit a tool, such as a screwdriver is used to twist the socket 12 for attachment to the printed circuit board 70.

The description will next be focused on mounting the lamp 18 in the lamp receptacle 16. The lamp 18 includes a pair of conventional contact wires 78 and 80 that project from the base 82 of the lamp, see FIG. 5. The lamp 18 may be inserted and seated in the receptacle 16 mechanically or by hand. With the wire divider means 30 the lamp 18 may be inserted without fear that the wires 78 and 80 will not be fed for proper insertion into the base 14.

With the truncated projection 32 each wire 78 and 80 will feed through the tapered funnel openings 26 and 28 and pass out through the bottom 24 of the base 14 as the lamp is inserted. The lamp 18 is positioned so that the lamp base 82 will rest on and bear against the lamp top surface 34.

Figure 5:
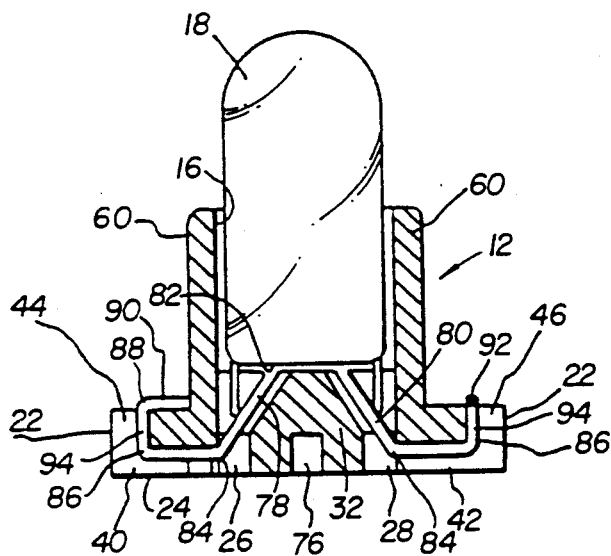
FIG. 5 is a cross sectional side elevational view taken on line 5—5 of FIG. 4.

As seen in FIG. 5 each wire 78 and 80 is bent at 84 to seat in the respective lead wire guide grooves 40 and 42 to extend outwardly toward the side wall 22. The wires 78 and 80 are again bent at 86 to interfit in the respective normal vertical grooves 44 and 46. At the top flat annular surface 20 the wires 78 and 80 are bent at 88 where top portions or reaches 90 and 92 (FIG. 4) respectively are formed to lay flush on the top 20 for contact along their entire surface.

Figure 7:
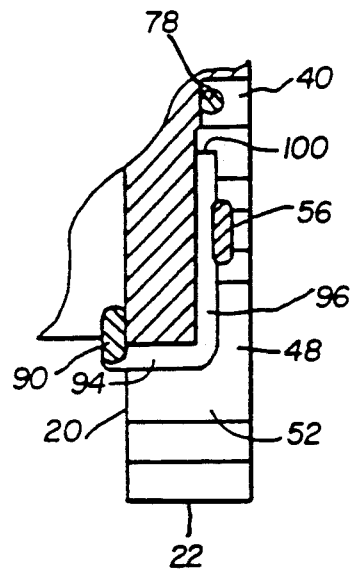
FIG. 7 is a partially cut-away enlarged sectional view taken on line 7—7 of FIG. 6.

At vertical lead wire insertion grooves 52 and 54 respectively the contact wires 78 and 80 are again bent downwardly forming a vertical reach 94 (FIG. 7) in that fit the grooves 52 and 54. At the return lead wire stopper grooves 48 and 50 the respective contact wires 78 and 80 are bent forming an end reach 96 and 98 (FIG. 7) with the wires terminating in ends 100 and 102.

Figure 6:
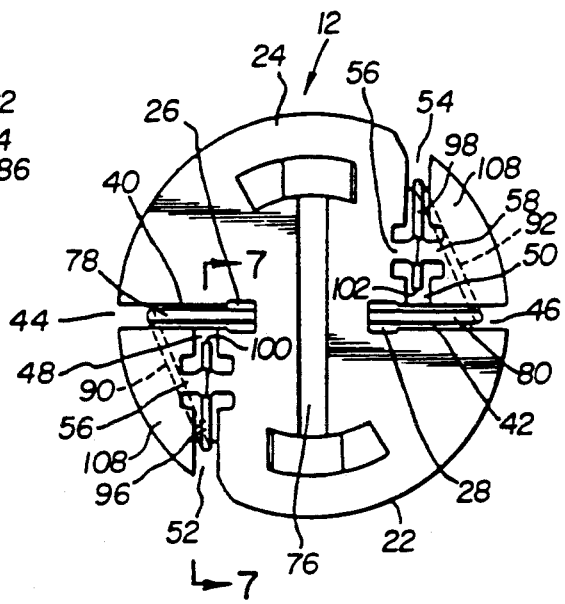
FIG. 6 is a bottom view of the lamp base of FIG. 4.

In order to maintain the end reaches 96 and 98 firmly within the grooves 48 and 50 the tabs 56 and 58 respectively are deformed, such as seen in FIG. 6 and or previously discussed.

As can be seen with each bend the wires 78 and 80 are tightly locked in the respective grooves to prevent movement of the lamp 18. Also with respect to the reaches 90 and 92 due to the length thereof of full contact caused by the spacing of the vertical grooves 44, 46, 52 and 54, the wear positioned of the surface 20 by the reaches when the socket 12 is in the printed circuit board 70 is reduced to a minimum. Thus a tight fit to the board 70 such as seen in FIG. 10, will ensue.

Figure 8:
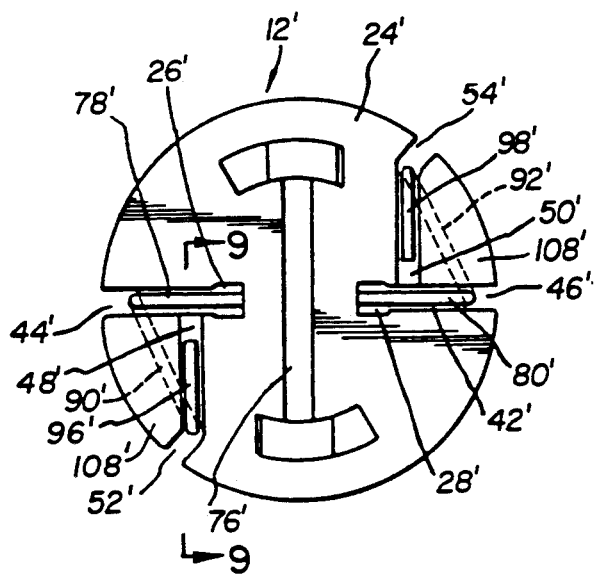
FIG. 8 is a bottom view illustrating a modified embodiment of the lamp socket of the present invention.

In a modified embodiment of the socket 12' illustrated in FIGS. 8, 9, and 11, the lead wire stopper grooves 48' and 50' are tapered upwardly from vertical grooves 52' and 54' so that these grooves are gradually deepened. The depths of the groove bottom 104 is such as to prevent disengagement from the surface 20' of the base 14' even when the wires 78 or 80 warp due to elasticity. Other configurations of the invention are completely the same as those in the preceding embodiment.

The reaches 96' are set to contact the groove bottoms 104 of the lead wire stopper grooves 48' and 50' and where the angle of the bottom 104 being less than horizontal, it will be seen, that there will be a tight crimped type of contact. Vibrations will not cause the reach 96' to move which in turn could cause faulty contact.

To insert the combination of assembled lamp socket 12 or 12' and lamp 18, the receptacle 16 is passed through opening 72 in the board 70. The base 14 is turned and the locking means 62 will lock the board 70 and base 12 together as can be seen in FIGS. 10 and 11. This will cause the reaches 90, 92, or 90' and 92' to contact the conventional conductive strip 106 and complete an electrical circuit.

The upper top surface 20 of the base 14 on which the reach 90 and 92 is laid to contact the conductive strip 106 of the printed board 70 is flat as previously described. In addition, a chord area 108 of the base 14 bound by the groove 48, groove 44 and circumferential outer wall 22 is formed thicker than that of conventional lamp sockets to maintain greater strength. The same thickened chord area 108 is found between grooves 50 and 54 and circumferential wall 22.

The thickened configuration or chord area 108 just described will prevent or at least deter "grooving" of the top surface 20 by the wire reaches 90 and 92. In the prior art devices the plastic being then without the thickened chord area 108 would heat up quickly and the reach 90 and 92 would be pressed into the surface 20 creating a groove. This would depress the wire reach 90 and 92 into the base 20 and gaps in contacting the conductive strips 106 would occur.

Further, in some of the prior art the top surfaces were not flat but were interrupted by protrusions. However, with a flat surface 20 the reaches 90 and 92 will contact the entire surface, again assuring uninterrupted contact and no gaps. The prior art only had a contact area above the protrusion.

The invention and its attendant advantages will be understood from the foregoing description and it will be apparent that various changes may be made in the form, construction and arrangements of the parts without departing form the spirit and scope thereof or sacrificing its material advantages, the arrangements hereinbefore described being merely by way of example. I do not wish to be restricted to the specific forms shown or uses mentioned, except as defined in the accompanying claims, wherein various portions have been separated for clarity of reading and not for emphasis.

We claim:

1. A lamp socket including a lamp receptacle and an annular base portion below said receptacle projecting radially outwardly of said receptacle and having a flat planar top surface, said socket adapted to be used with a printed circuit board that includes a bottom surface with an electrically conductive area which conveys energy to illuminate said lamp, said base portion having a top locking means projecting from said receptacle adapted to retain said socket to said board by sandwiching said board between said board locking means and the top of said base, said lamp being baseless and including at least two lead wires projecting therefrom, first generally vertical wire insertion holes projecting through said base and said receptacle, and a plurality of wire receiving grooves formed in said base and at least two of said wire receiving grooves communicating with some of said holes, and said grooves receiving said portions of said lead wires so that part of the wires form reaches which are adapted to engage said conductive areas of said board for lumination, the improvement comprising:

a wire guide divider and stop means provided in said receptacle adjacent said base and communicating with at least a pair of said passageways wherein said divider and stop means include, a truncated projection extending diametrically across said lamp receptacle, said projection including a pair of opposed smooth guide walls each terminating adjacent a passageway, and a top stop surface of a width less than one half the diameter of said socket, which acts as a wire divider and stop for inward insertion of said lamp of said receptacle;

an arcuate smooth wall formed within said receptacle opposite each guide wall and funneling to said passageway, whereby insertion of said lamp into said receptacle will allow each of said lead wires to be automatically threaded into said respective passageways through said uninterrupted wire guide divider and stop means and said reaches extending across said planar top surface between said grooves and engaging said top surface throughout its length between said groove for uninterrupted wedgingly conductive contact with said conductive areas of said circuit board.

2. A lamp socket as defined in claim 1 wherein at least two of said wire receiving grooves include:
retention means to maintain a wire passing therethrough in a set position to prevent unnecessary movement and dislodgement of said wire.

3. A lamp socket as defined in claim 2 wherein said retention means includes:
a pair of locking tabs projecting across each of said wire receiving grooves, said tabs adapted to be deformed and engage said wire to lock the same in each of said grooves.

4. A lamp socket as defined in claim 2 wherein said retention means includes:
a pair of grooves each of which includes a bottom surface that is tapered at an acute angle relative to the plane of said top surface of said base wherein wire passing into each groove is upset with a bend at said acute angle wedging the same against movement.

* * * * *